United States Patent
Umeyama et al.

[19]

[11] Patent Number: 5,834,969
[45] Date of Patent: Nov. 10, 1998

[54] CIRCUIT FOR PROCESSING SIGNALS FROM A MAGNETO-RESISTIVE HEAD

[75] Inventors: Takehiko Umeyama; Tsutomu Kamifuji, both of Tokyo, Japan

[73] Assignee: Mitsubishi Denki Kabushiki Kaisha, Tokyo, Japan

[21] Appl. No.: 886,472

[22] Filed: Jul. 1, 1997

Related U.S. Application Data

[63] Continuation of Ser. No. 593,352, Jan. 29, 1996, abandoned.

[30] Foreign Application Priority Data

Jul. 24, 1995 [JP] Japan .................................. 7-187263

[51] Int. Cl.$^6$ ..................................................... H03K 5/00
[52] U.S. Cl. ........................... 327/553; 327/551; 327/558; 327/174; 327/185; 360/46; 360/61
[58] Field of Search ..................................... 327/552, 553, 327/555, 556, 557, 558, 559, 311, 174, 165, 551, 77; 330/305; 360/46, 61

[56] References Cited

U.S. PATENT DOCUMENTS

| | | | |
|---|---|---|---|
| 3,678,416 | 7/1972 | Burwen .................................. | 327/553 |
| 3,959,731 | 5/1976 | Pomerantz et al. ........................ | 327/27 |
| 4,207,543 | 6/1980 | Izakson et al. .......................... | 327/553 |
| 4,914,398 | 4/1990 | Jove et al. .............................. | 327/552 |
| 5,220,220 | 6/1993 | Tse et al. ............................... | 327/553 |
| 5,270,875 | 12/1993 | Shah et al. .............................. | 360/46 |
| 5,396,188 | 3/1995 | Aoki ...................................... | 327/552 |
| 5,418,661 | 5/1995 | Nakamura ................................ | 360/65 |
| 5,428,314 | 6/1995 | Swafford et al. ........................ | 330/149 |
| 5,648,738 | 7/1997 | Welland et al. ......................... | 327/307 |

OTHER PUBLICATIONS

W. Levin, "Band Switching an Active Filter", IBM Technical Bulletin, vol. 13, No. 3, p. 611, Aug. 1970.

*Primary Examiner*—Timothy P. Callahan
*Assistant Examiner*—Dinh Le
*Attorney, Agent, or Firm*—Leydig, Voit & Mayer

[57] ABSTRACT

A signal reproduction circuit used for an MR head has a simple circuit configuration to suppress a disturbance signal caused by the contact between the MR head and a disk, and to remove the ripples completely from the reproduced signal. The signal reproduction circuit used for the MR head includes a first circuit for generating a switching signal in accordance with a disturbance signal extracted from an input data signal, a second circuit including a filter circuit and a switching circuit, the filter having a first and a second cut-off frequency, the switching circuit for switching either the first of second cut-off frequency for outputting an un-suppressed data signal and a suppressed disturbance signal.

18 Claims, 17 Drawing Sheets

DATA SIGNAL

DISTURBANCE SIGNAL

DATA SIGNAL ON WHICH
DISTURBANCE SIGNAL IS
SUPERPOSED

DATA SIGNAL ON WHICH
DISTURBANCE SIGNAL IS
SUPERPOSED

OUTPUT SIGNAL
FROM DELAY CIRCUIT 2

OUTPUT SIGNAL
FROM ADDER 6

OUTPUT FROM
DISTURBANCE SIGNAL
SUPPRESSION CIRCUIT 82

CIRCUIT FOR PROCESSING SIGNALS FROM A MAGNETO-RESISTIVE HEAD

This disclosure is a continuation of patent application Ser. No. 08/593,352, filed Jan. 29, 1996, now abandoned.

BACKGROUND OF THE INVENTION

1. Field of the Invention

The invention relates to a hard disk drive and, more particularly, to a signal reproduction circuit used for a head including a magneto-resistance element (referred to as an MR head). The signal reproduction circuit has a simple configuration and is used mainly in a read amplifier that drives an MR head in order to suppress disturbances and thermally increased resistance in the MR head.

2. Description of the Prior Art

FIG. 14 is a block diagram of a hard disk drive. In FIG. 14, data recorded on a disc 58 is read out through an MR head 62. The signal from the MR head 62 is transmitted to a personal computer 50 to be processed via a read/write (R/W) amplifier 56, a read channel 54, and a hard disk controller (HDC) 52. The position of the MR head 62 is controlled by a voice coil motor (VCM) 66 via the read/write channel 54, a CPU 72, and a VCM driver 68. The rotation of the disc 58 is controlled by an SPM motor 64 via the read/write channel 54, the CPU 72, and an SPM driver 70. The data signal is transmitted according to instructions from the personal computer 50 to the write head 60 via the HDC 52, the read channel 54, and the R/W amplifier 56. The data is recorded on the disc 58 by means of a write head 60.

Usually, the MR head 62 is in a floating state and does not touch the surface of disk 58. If the MR head 62 touches the disc 58 because of some factor, the MR head 62 is momentarily heated to a high temperature, and the resistance of the MR head 62 is raised. The contact usually occurs momentarily, and the MR head 62 is rapidly separated from the disk 58. The heat generated in the MR head 62 is, however, slowly radiated. As a result, a long-period disturbance signal is generated as shown in FIG. 16B. This disturbance signal of FIG. 16B is superposed on a data signal read from the disk 58, shown in FIG. 16A, and the data signal shown in FIG. 16C is output from the MR head 62. When the MR head is heated to a high temperature, the resistance of the MR head rises, and a disturbance signal generated due to the increase in resistance in the MR head 62 is superposed on a data signal. This phenomenon is called "thermal asperity".

FIG. 15 shows an example of the conventional R/W amplifier 56 shown in FIG. 14. In FIG. 15, a signal read by the MR head 62 from the disk 58 is amplified by an amplifier 80. In a disturbance signal suppression circuit 82, thermal disturbance in the signal from the MR head 62 is eliminated. Finally, the signal is output from output terminal 200.

FIGS. 16A–16C are waveform diagrams that show effects of a disturbance on a data signal. FIG. 16A depicts a data signal from the MR head 62. FIG. 16B depicts a change in the resistance of the MR element before and after the MR head 62 touches the surface of the disc 58. FIG. 16C depicts a signal generated when a disturbance signal, caused by a rise in the resistance in the MR head due to the heat generated by contact, is superposed on the data signal.

FIG. 17 shows one example of a circuit diagram for the disturbance signal suppression circuit 82 of FIG. 15. In FIG. 17, the disturbance signal suppression circuit 82 comprises an input terminal 100, a delay circuit 2, circuits 3 and 4 for extracting the disturbance envelope, a buffer 5, adders 6 and 9, a low pass filter 7, an attenuator 8, and an output terminal 200.

FIGS. 18B–18D show signal waveforms in each part of the disturbance signal suppression circuit 82. The disturbance signal, which is superposed on the data signal as shown in FIG. 18A, is input to input terminal 100. FIG. 18B shows an output waveform from the delay circuit 2. FIG. 18C shows an output waveform from the adder 6. FIG. 18D shows an output waveform from the adder 9, namely, a waveform of the data signal output from the terminal 200 of the disturbance signal suppression circuit 82.

The operation of the circuit shown in FIG. 17 is described. In the circuit of FIG. 17, the upper envelope of the waveform shown in FIG. 18A is extracted by the envelope extracting circuit 3. The lower envelope of the waveform shown in FIG. 18A is extracted by the envelope extracting circuit 4. The envelopes are added in the adder 6 and transmitted to a low pass filter 7. The signal amplitude is adjusted in an attenuator 8. Finally, the signal passed through the attenuator 8 is inverted and then delayed by the delay circuit 2 and added to a disturbance signal, input to input terminal 100, to obtain a signal as shown in FIG. 18D.

In other words, a disturbance signal (see FIG. 18C) is extracted from the signal (FIG. 18A) input into the terminal 100 by means of the envelope extracting circuits 3 and 4, the buffer 5, and the adder 6. The extracted disturbance signal is adjusted in the low pass filter 7 and the attenuator 8 and added to the data signal passed through delay circuit 2. This method eliminates the disturbance signal superposed on the data signal by inverting and adding (or subtracting) the disturbance signal to the data signal passed through the delay circuit 2.

However, since the circuit configuration of the disturbance signal suppression circuit is complicated and the characteristics of the elements comprising the circuit are not precise because the elements are difficult to manufacture accurately, ripple caused by disturbance signals remains.

SUMMARY OF THE INVENTION

According to one aspect of the present invention, a signal reproduction circuit used for an MR head comprises a first circuit for generating a switching signal in accordance with a disturbance signal extracted from an input data signal; and a second circuit comprising a filter circuit and a switching circuit, the filter circuit having first and second cut-off frequencies, the switching circuit selecting either the first or second cut-off frequency depending on the switching signal from the first circuit, for outputting an un-suppressed data signal and a suppressed disturbance signal.

According to another aspect of the present invention, a first circuit of a signal reproduction circuit used for an MR head comprises a comparator for comparing the data signal with a first reference potential and outputting a first level comparison signal if the level of the data signal is lower than the first reference potential, and outputting a second level comparison signal if the level of the data signal is higher than the first reference potential; and a waveform extending circuit for extending the comparison signal received from the comparator and outputting a switching signal according to a second reference potential.

According to a further aspect of the present invention, a first circuit of a signal reproduction circuit used for an MR head comprises a comparator for comparing the data signal with a first reference potential and outputting a first level switching signal if the level of the data signal is lower than the first reference potential and outputting a second level switching signal if the level of the data signal is higher than the first reference potential.

Preferably, the second circuit is a high pass filter or a band pass filter.

According to a further aspect of the present invention, a first circuit of a signal reproduction circuit used for the MR head comprises an input terminal to which a data signal from the MR head is input; an output terminal; a comparator with a first input node connected to the input terminal and a second input node connected to a reference potential, for outputting a second level comparison output signal when an input signal level on the input terminal is higher than the reference potential, and for outputting a first level comparison output when input signal level on the input terminal is lower than the reference potential; a waveform extending circuit for outputting a switching signal by extending the comparison output received from the comparator, based on a second reference potential; and a high pass filter connected between the input and output terminals for restricting input signal frequencies lower than a cut-off frequency, in accordance with the switching signal.

According to a further aspect of the present invention, a first circuit of a signal reproduction circuit used for an MR head comprises an input terminal to which a data signal from the MR head is input; an output terminal; a comparator with a first input node connected to the input terminal and a second input node connected to a reference potential, for outputting a second level comparison output when an input signal level on the input terminal is higher than the reference potential, and for outputting a first level comparison output when input signal level on the input terminal is lower than the reference potential; a waveform extending circuit for outputting a switching signal by extending the comparison output received from the comparator, based on a second reference potential; and a band pass filter connected between the input and output terminals for restricting input signal frequencies lower than a cut-off frequency, according to the switching signal.

According to a further aspect of the present invention, a first circuit of a signal reproduction circuit used for the MR head comprises an input terminal to which a data signal from the MR head is input; an output terminal; a comparator with a first input node connected to the input terminal and a second input node connected to a reference potential, for outputting a second level comparison output when an input signal level on the input terminal is higher than the reference potential, and for outputting a first level comparison output when an input signal level on the input terminal is lower than the reference potential; and a high pass filter connected between the input and output terminals for restricting input signal frequencies lower than a cut-off frequency, in accordance with a switching signal.

According to a further aspect of the present invention, a first circuit of a signal reproduction circuit used for an MR head comprises an input terminal to which a data signal from the MR head is input; an output terminal; a high pass filter connected between the input and output terminals for restricting input signal frequencies lower than a cut-off frequency.

DETAILED DESCRIPTION OF THE PREFERRED EMBODIMENTS

Embodiment 1.

Figure 1:
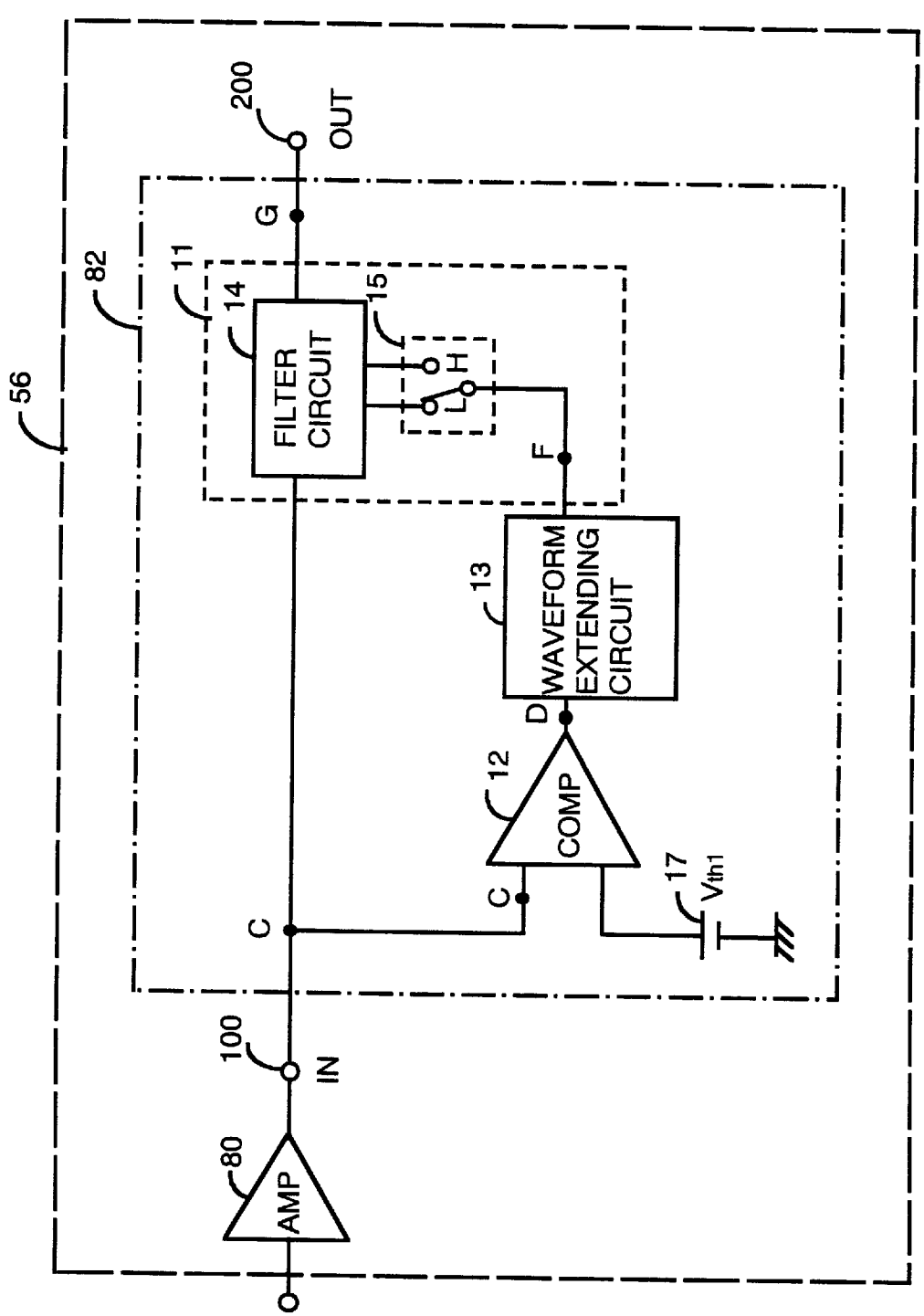
FIG. 1 shows a system which suppresses a disturbance component in a read data signal according to a first embodiment of the invention.
Figure 2:
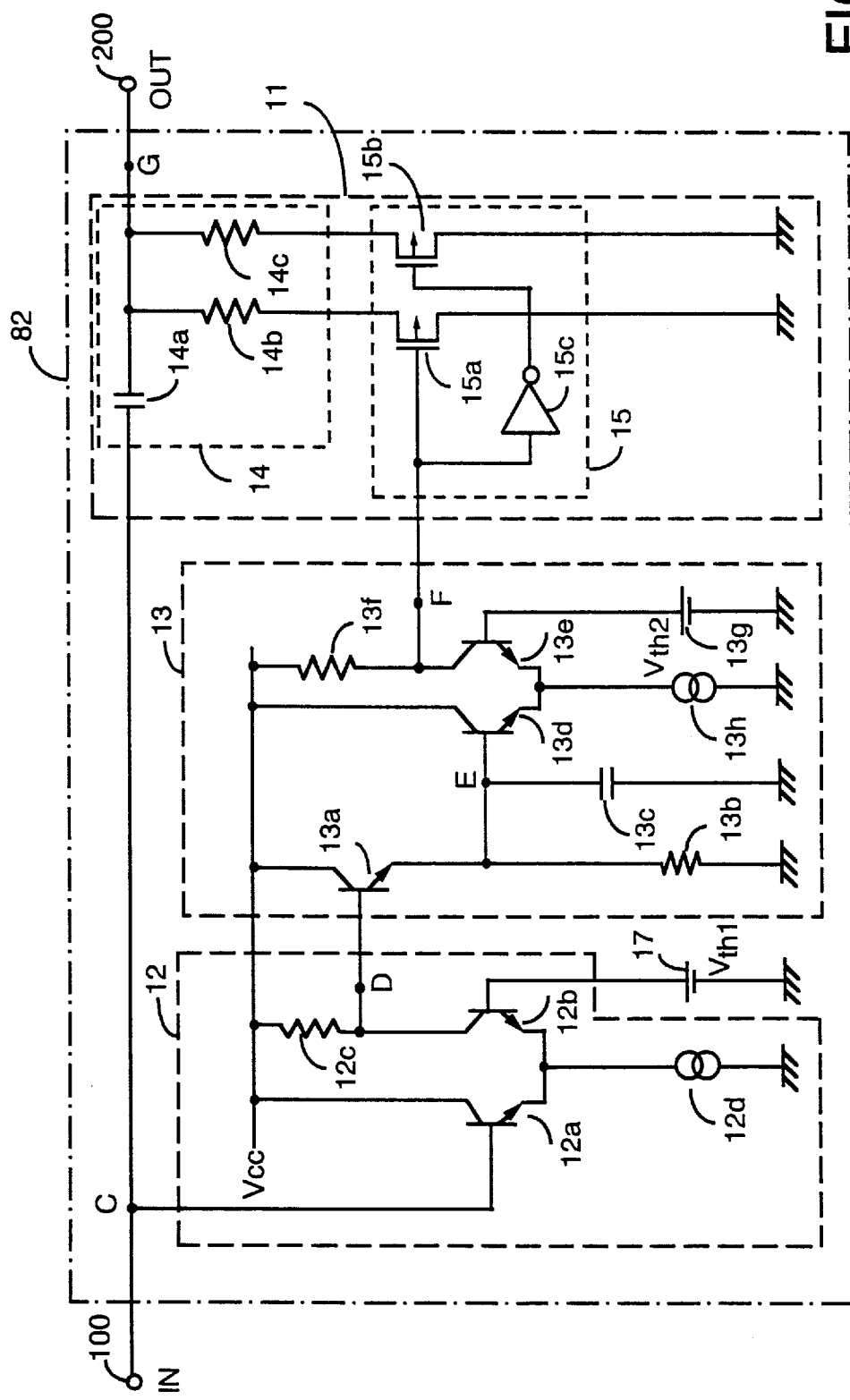
FIG. 2 shows a disturbance signal suppression circuit according to the first embodiment of the invention.
Figure 15:
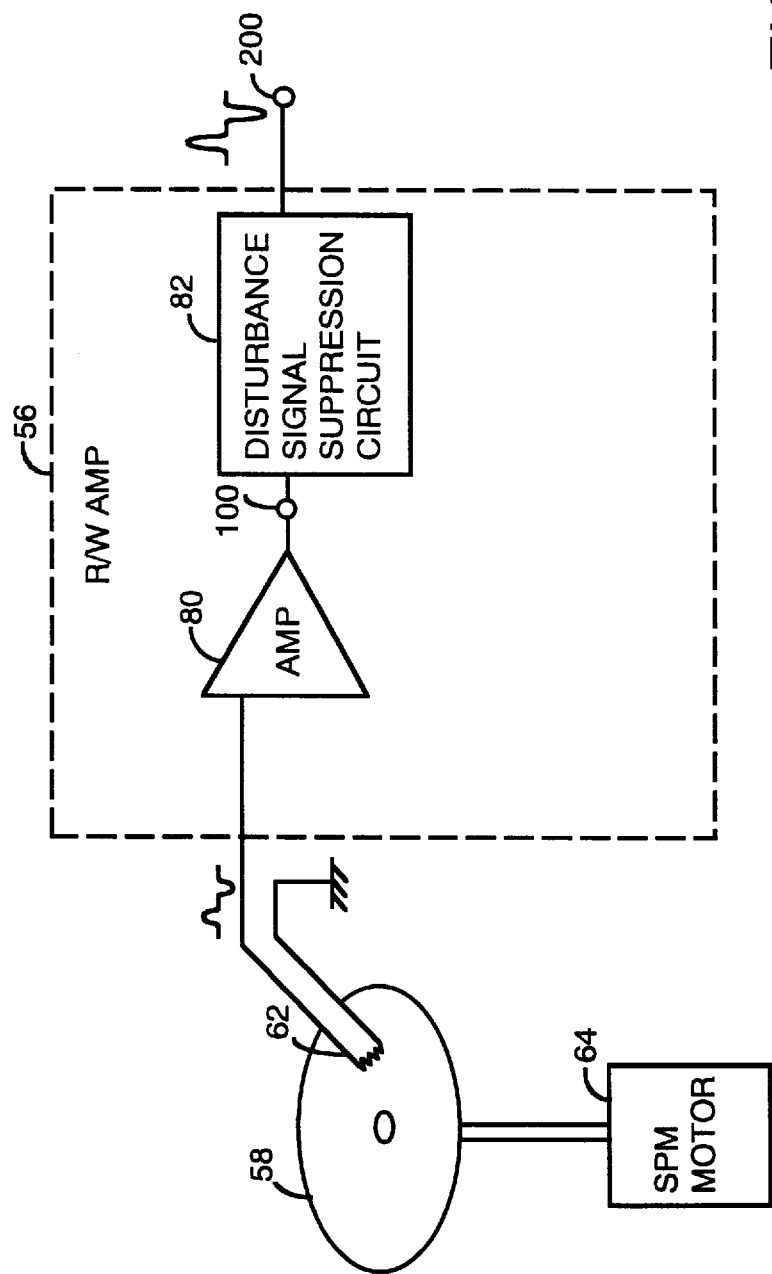
FIG. 15 shows an example of a conventional read/write (R/W) amplifier.

FIG. 1 and FIG. 2 show disturbance signal suppression circuits 82 which suppress a disturbance waveform according to a first embodiment of the invention. These disturbance signal suppression circuits 82 are a part of the R/W amplifier 56 and may also be used as substitutes for a conventional disturbance signal suppression circuit 82 shown in FIG. 15.

Figure 4:
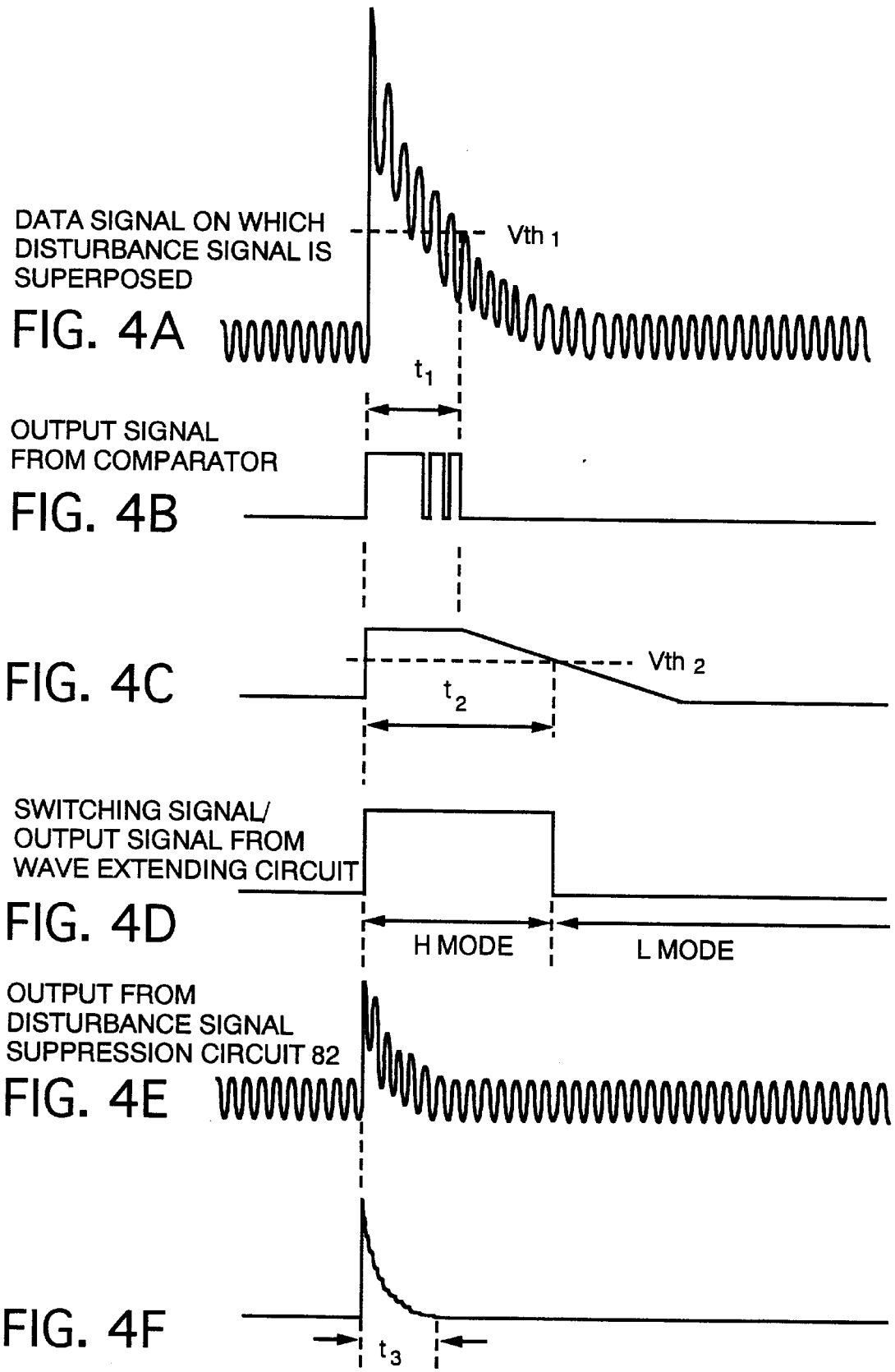
FIG. 4A shows a signal waveform at a point C shown in FIG. 1 and FIG. 2.
FIG. 4B shows a signal waveform at a point D shown in FIG. 1 and FIG. 2.
FIG. 4C shows a signal waveform at a point E shown in FIG. 1 and FIG. 2.
FIG. 4D shows a signal waveform at a point F shown in FIG. 1 and FIG. 2.
FIG. 4E shows a signal waveform at a point G shown in FIG. 1 and FIG. 2.
FIG. 4F shows a signal waveform of a suppressed disturbance component of the waveform in FIG. 4G.

In FIG. 1, data signals read out from the disc 58 by means of an MR head 62 are amplified and input to the input terminal 100 of the disturbance signal suppression circuit 82. When the MR head 62 momentarily touches the disc 58, a data signal, for example, such as shown in FIG. 4A, is input to the input terminal 100. After a disturbance signal has been suppressed, a data signal, for example, such as shown in FIG. 4E, is output from the output terminal 200 of the disturbance signal suppression circuit 82.

Figure 3:
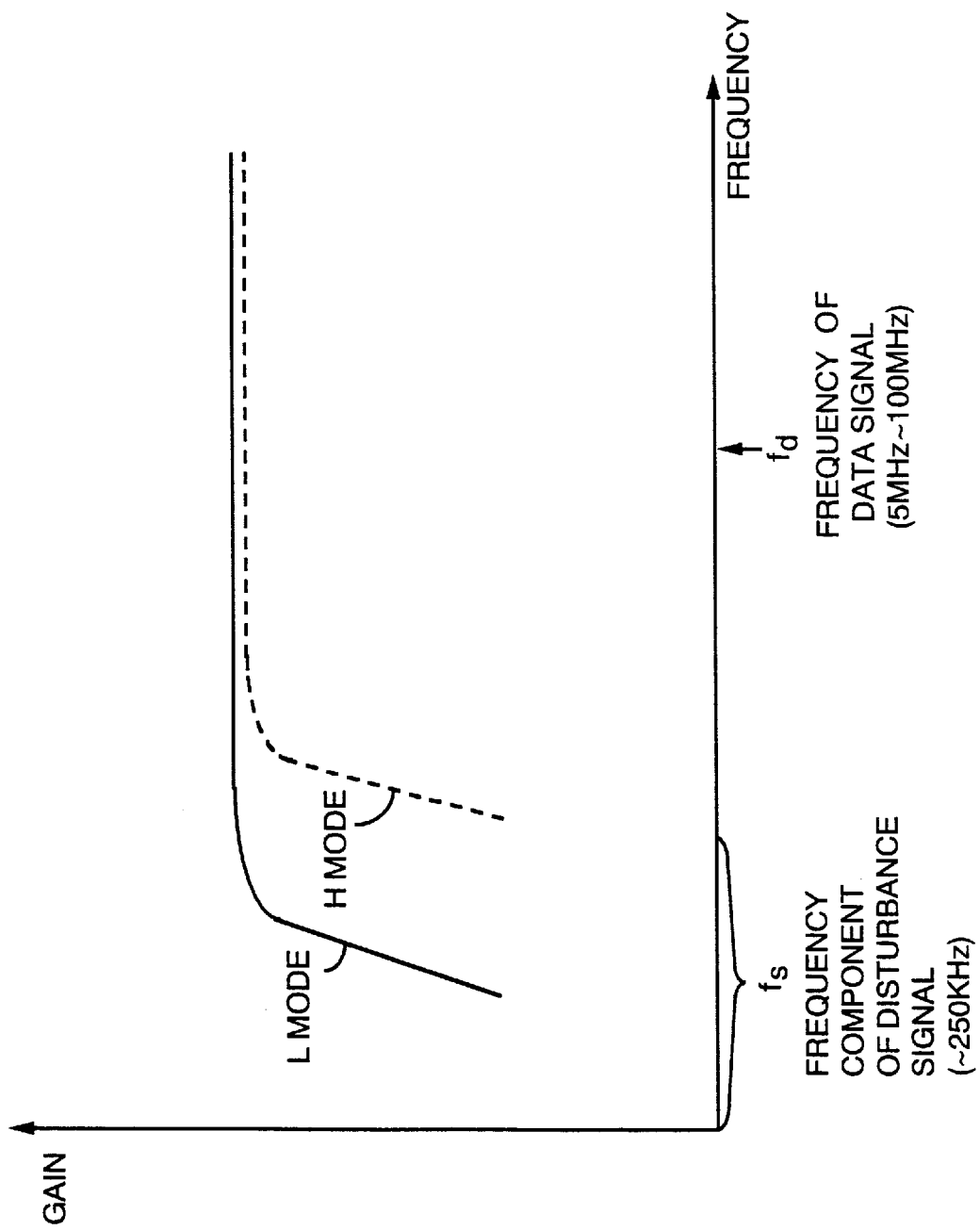
FIG. 3 shows frequency characteristics of a high pass filter shown in the system represented by FIG. 1.

Data signals input to the input terminal 100 are received in a band pass filter. According to a switching signal, the high pass filter 11 selects either L mode (for example, a cut-off frequency of about 100 kHz) or H mode (for example, a cut-off frequency of about 500 kHz-1 MHz), as shown in FIG. 3. The high pass filter 11 cuts off frequencies lower than the cut-off frequency of the data signals received in either mode and outputs the data signal to the output terminal 200. FIG. 2 shows a diagram of a filter 14 in both L mode and H mode and a switch 15 for switching the mode of the filter 14.

In FIG. 2, a capacitor 14a is connected between the input terminal 100 and the output terminal 200. One end of a first resistor 14b is connected to the output terminal of the capacitor 14a. If the other end of the resistor 14b is grounded, this resistor 14b and the capacitor 14a constitute a high pass filter with a high cut-off frequency (H mode). Furthermore, one end of a second resistor 14c is also connected to the output terminal of the capacitor 14a. If the other end of this resistor 14c is grounded, this resistor 14c and the capacitor 14a constitute a high pass filter with a low cut-off frequency (L mode). The capacitor 14a, the resistor 14b, and the resistor 14c comprise the filter 14.

A first switch 15a comprises an N type MOS transistor which receives a switching signal, shown in FIG. 4F, at the control electrode. The first switch 15a is connected between the other end of the resistor 14b and a ground node. A second switch 15b comprises an N type MOS transistor that receives an inverted switching signal, shown in FIG. 4D, at its control electrode. The second switch 15b is connected between the other end of resistor 14c and a ground node. The inverter 15c receives the switching signal shown in FIG. 4D and inverts it and transmits it to the control electrode of the second switch. The first and second switches 15a and 15b and the inverter 15c constitute a switch 15. For example, this switch may include a CMOS inverter comprising a P type MOS transistor and an N type MOS transistor connected serially between a power supply node and ground.

Referring to FIG. 1, comparator 12 compares a data signal input into input terminal 100 with a reference potential $V_{th1}$ and outputs a first level (L level) when the input signal is lower than the reference potential and outputs a second level (H level) when the input signal is higher than the reference potential. An example of a comparator 12 is shown in FIG. 2.

The comparator 12 comprises a first NPN bipolar transistor 12a having a collector electrode connected to a power supply potential node Vcc, a base electrode connected to the input terminal 100, and an emitter electrode connected to the ground via a constant current source 12d. The comparator 12 also comprises a second NPN bipolar transistor 12b having a collector connected to the power supply potential node via resistor 12c, and a base connected to a constant voltage reference power supply 17 that provides a reference potential $V_{th1}$. The first NPN bipolar transistor 12a and the second NPN bipolar transistor 12b constitute a differential transistor pair connected to each other via their emitter electrodes. The constant current source 12d draws a constant current from the emitter electrode where both first and second NPN bipolar transistors 12a and 12b are connected to each other. Comparator 12 comprises the first and second NPN bipolar transistors 12a and 12b, the resistor 12c, and the constant current source 12d.

Referring to FIG. 1, the waveform extending circuit 13 receives an output signal of FIG. 4D from the comparator 12, extends the output signal with reference to a second reference voltage $V_{th2}$, and generates a switching signal, as illustrated in FIG. 4D. The switching signal of FIG. 4F is output from the waveform extending circuit 13 to the switch 15 in the high pass filter 11. An example of the waveform extending circuit 13 is shown in FIG. 2.

In FIG. 2, the waveform extending circuit 13 comprises a third NPN bipolar transistor 13a having a collector electrode connected to the power supply potential node, an emitter electrode connected to the ground potential node via a resistor 13b, and a base electrode connected to the output node D of the comparator 12. A capacitor 13c connected between the emitter electrode of the third NPN bipolar transistor and the ground node is charged when the third NPN bipolar transistor 13a is turned on. This charge is discharged via resistor 13b when the NPN bipolar transistor 13a is turned off. When the output (point D) of the comparator 12 falls, as shown in FIG. 4B, the charge on the capacitor 13c begins to decrease, as shown in FIG. 4C, according to a time constant determined by the resistor 13b and the capacitor 13c.

The waveform extending circuit 13 further comprises a fourth NPN bipolar transistor 13d having a collector electrode connected to the power supply potential node and a base electrode connected to the connection node of the emitter electrode of the third NPN bipolar transistor 13a and the resistor 13b. The waveform extending circuit 13 further comprises a fifth NPN bipolar transistor having a collector connected to the power supply potential node via a resistor 13f, and a base electrode connected to a constant voltage source 13g that provides a reference potential $V_{th2}$. The fourth NPN bipolar transistor 13d and the fifth NPN bipolar transistor 13e constitute a differential transistor pair with the transistors connected to each other via their emitter electrodes. A constant current source 13h draws a constant current from the emitter electrodes where the fourth and fifth NPN bipolar transistors 13d and 13e are connected in common. The waveform extending circuit 13 comprises the third, fourth, and fifth NPN bipolar transistors 13a, 13d, and 13e, the resistors 13b and 13f, and the capacitor 13c.

The read/write (R/W) amplifier 56 (see FIG. 15) comprising the disturbance signal suppression circuit 82 is manufactured as a semiconductor integrated circuit on a single semiconductor substrate.

The operation of the disturbance signal suppression circuit 82 is explained below. A disturbance signal, generally having a frequency less than 250 kHz, is superposed on a data signal of frequency fd (for example, 5 MHz-100 MHz) read out from disc 58 by means of the MR head 62. Assume that the superposed data signal (FIG. 4A) having been amplified in amplifier 80 (see FIG. 15) is input to the input terminal 100. When a disturbance signal is not superposed, i.e., only a data signal is present, the voltage of the data signal is lower than a reference voltage $V_{th1}$ of the constant voltage source 17 (for example, 100 mV-300 mV). Since both the output from the comparator 12 and the output from the waveform extending circuit 13 are at the first level (low level), the high pass filter 11 selects the L mode. Accordingly, since data signals input into high pass filter 11 pass through the L level mode high pass filter with a low cut-off frequency, a data signal unaffected by a disturbance signal is output from output terminal 200.

If a superposed disturbance signal is input, the level of the output from the comparator 12 rises from the first level to the second level (high level) since the data signal exceeds the reference voltage $V_{th1}$ of the constant voltage source 17 due to the disturbance signal. As time passes, the data signal becomes gradually lower than the reference voltage $V_{th1}$ of the constant voltage source 17 since the voltage level of the disturbance signal falls gradually; that is, the level of the output from the comparator 12 falls from the second level to the first level. In other words, when the input signal exceeds the reference voltage $V_{th1}$, the first NPN transistor 12a turns on and the second NPN transistor 12b turns off. The level of the collector potential of the second NPN bipolar transistor 12b then shifts from the second level to the first level. Alternatively, when the input signal falls lower than the reference voltage $V_{th1}$, the first NPN transistor 12a turns off and the second NPN transistor 12b turns on. The level of the collector potential of the second NPN bipolar transistor 12b then shifts from the second level to the first level. Finally, the signal of FIG. 4B is output from the comparator 12.

Receiving a signal as illustrated in FIG. 4B, the waveform extending circuit 13 outputs a signal, as illustrated in FIG. 4D, which has a second level during period $t_2$, where $t_2$ is an extended first level period $t_1$, extended by a predetermined period. In other words, when the output signal (point D) of comparator 12 is the second level, the third transistor 13a turns on. At the connection node of the third transistor 13a and resistor 13b, when the first level potential is received, the capacitor 13c is charged. When the output signal (point D) of the comparator 12 falls from the second level to the first level, the electric charge in capacitor 13c is discharged via resistor 13b. The potential at the connection node of the third transistor 13a and resistor 13b falls to the second level, according to a fixed time constant, and the signal of FIG. 4C is input to the base electrode of the fourth NPN bipolar transistor 13d.

The fourth and the fifth NPN bipolar transistors 13d and 13e, which comprise a differential transistor pair, operate as follows, according to the signal of FIG. 4C input to the base electrode of the fourth NPN bipolar transistor 13d. When the signal of FIG. 4C is higher than the reference voltage $V_{th2}$ of the constant voltage source 13g, the fourth NPN bipolar transistor 13d turns on and the fifth NPN bipolar transistor 13e turns off. Therefore, the collector potential of the fifth NPN bipolar transistor 13e becomes the second level. When the signal of FIG. 4C is lower than the reference voltage $V_{th2}$ at the constant voltage source 13g, the fourth NPN bipolar transistor 13d turns off and the fifth NPN bipolar transistor 13e turns on. Then, the collector potential of the fifth NPN bipolar transistor 13e becomes the first level. Accordingly, the signal shown in FIG. 4D is output from the waveform extending circuit 13.

The waveform extending circuit 13 is arranged to minimize the effects of the disturbance signal when the voltage of the disturbance signal falls below the reference voltage $V_{th1}$ of the comparator 12 as time passes. It is possible that reference voltage $V_{th1}$, in the comparator 12 may be set lower to minimize the effects of the disturbance signal. However, if the reference voltage $V_{th1}$ is set too low, there is the possibility that the second level signal will be output from the comparator 12 even if no disturbance signal is superposed. Therefore, it is likely to effect H mode of the high pass filter 11 when data signals are transmitted to the output terminal 200.

As described above, the signal of FIG. 4D output from waveform extending circuit 13 is input to the high pass filter 11 as a switching signal. In the high pass filter 11, the H mode is operative during the second level period $t_2$. During the H mode, for example, a data signal of 5 MHz–100 MHz passes through the high pass filter 11 and a disturbance signal less than 250 kHz is blocked. On the other hand, while a switching signal is at the first level (L mode), the L mode high pass filter is operated, and data signals including signals having low frequencies pass through the L mode high pass filter.

In other words, in high pass filter 11, the first switch 15a turns on while the switching signal is in the second level period $t_2$ and the second switch 15b, which receives an inversion of the switching signal, turns off. Therefore, the first resistor 14b is connected to a ground node, and the first resistor 14b and the capacitor 14a comprise the H mode high pass filter. During the H mode, the signal including the disturbance signal is greatly reduced and output as shown in FIG. 4E.

On the other hand, if the switching signal is in the first level (low level), the first switch 15a turns off, and the second switch 15b, which receives the inversion of the switching signal, turns on. Therefore, the second resistor 14c is connected to a ground node, and the second resistor 14b and capacitor 14a comprise an L mode high pass filter.

As described above, a data signal of FIG. 4A received from the input terminal 100 is output from the output terminal 200 as the data signal of FIG. 4E through the disturbance signal suppression circuit 82. As seen from FIG. 4E, it is easily understood that the input disturbance signal is largely eliminated by the disturbance signal suppression circuit 82. Although the data signals obtained in this way from the disturbance signal suppression circuit 82 may include a suppressed disturbance component as shown in FIG. 4F for a very short period $t_3$, data reproduction is not seriously affected since the period $t_3$ occupies, for example, only a few bytes of the data signal.

In brief, the disturbance signal suppression circuit 82 extracts a disturbance signal from input data signals to generate a switching signal according to the disturbance signal, applying the switching signal to the high pass filter in either H or L modes, and finally outputting a data signal with the disturbance signal suppressed.

Accordingly, when a data signal superposed with a disturbance signal is input to the disturbance signal suppression circuit 82, the high pass filter 11 operates in the L mode, and data signals are output from the output terminal 200 without restricting the signal frequency. On the other hand, when a disturbance signal is superposed, the high pass filter 11 operates in the H mode, suppressing the disturbance signal without suppressing data signals, which produces less distortion in a signal waveform output from the output terminal 200.

Embodiment 2.

Figure 5:
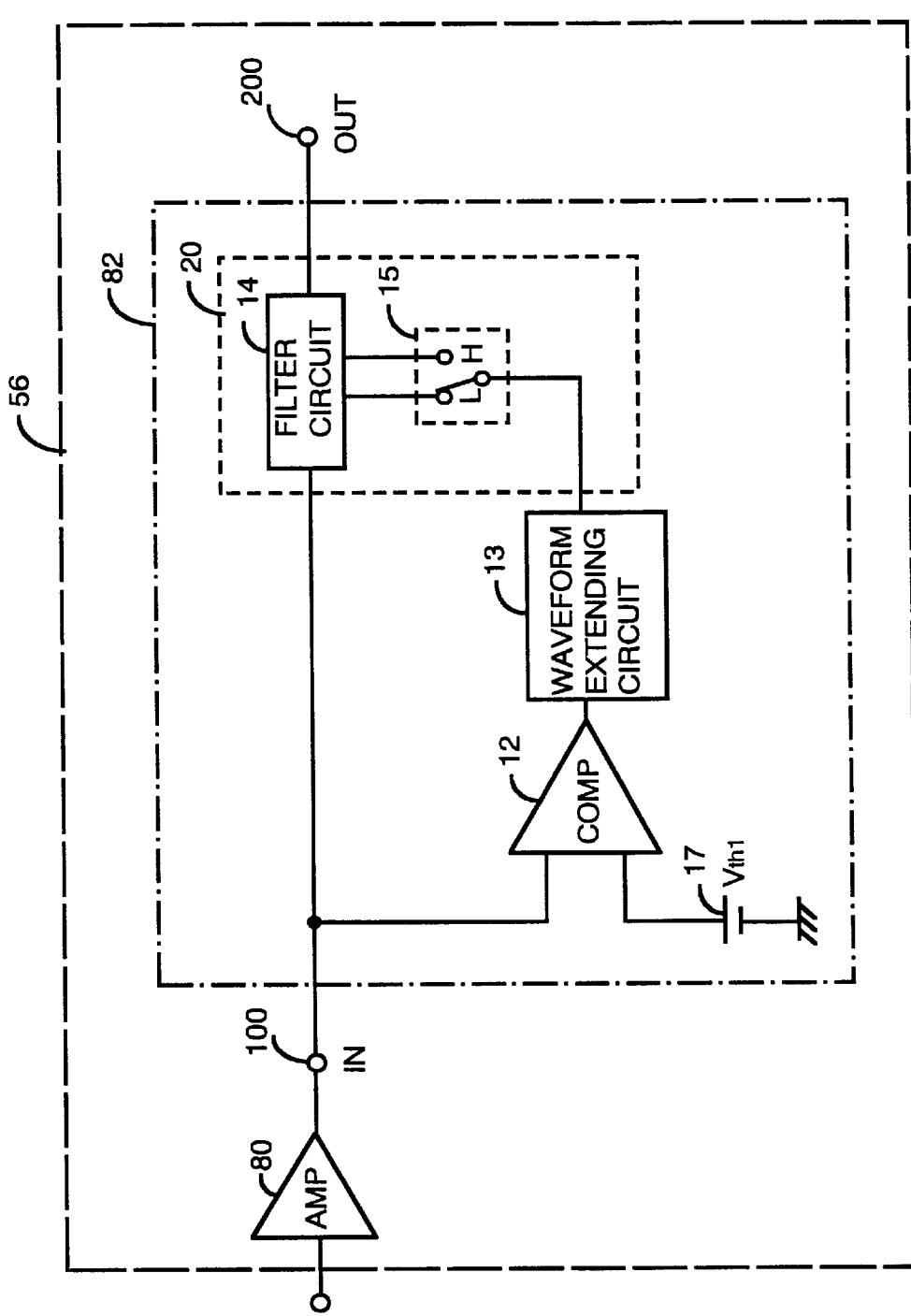
FIG. 5 shows a disturbance signal suppression circuit according to a second embodiment of the invention.
Figure 6:
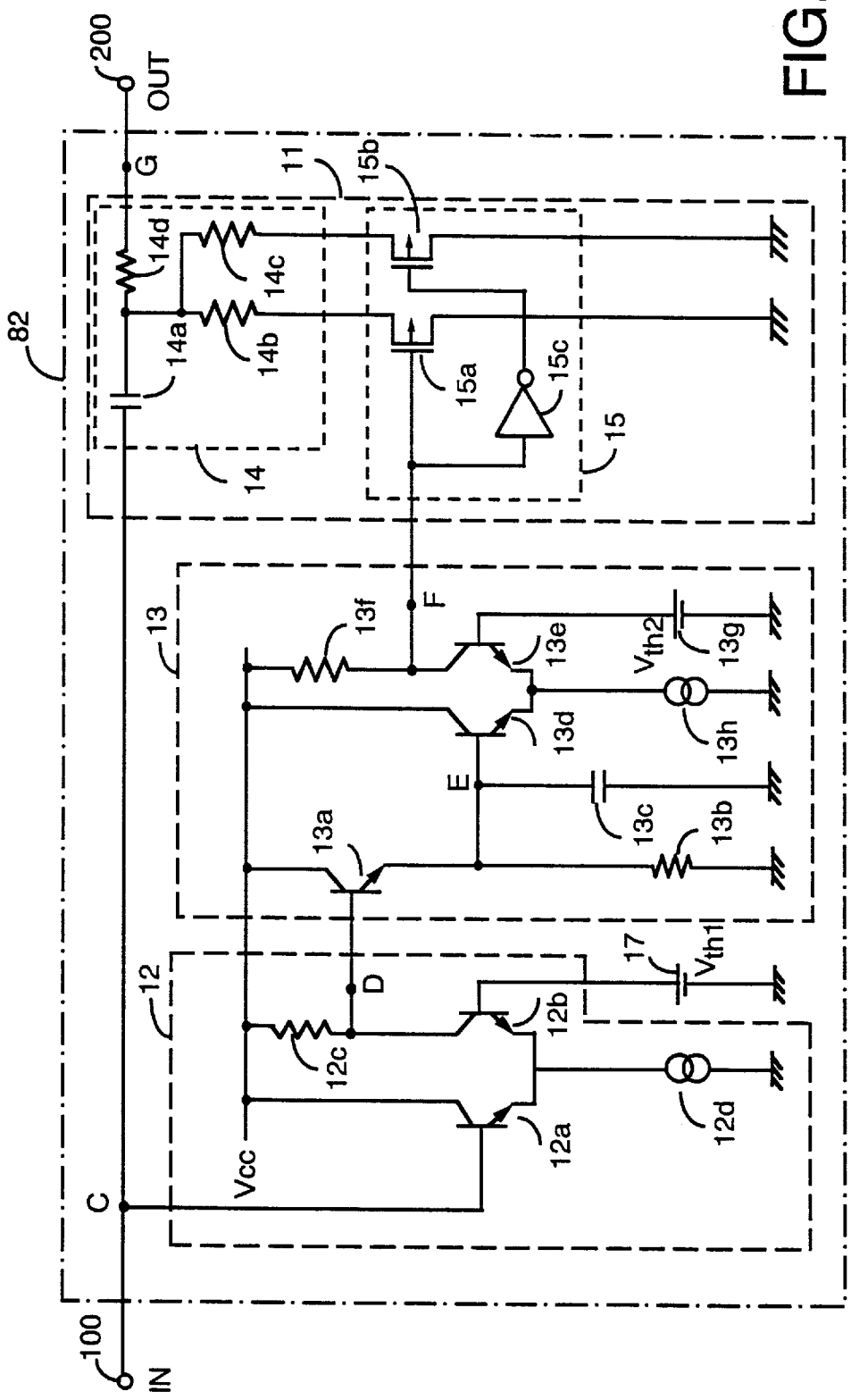
FIG. 6 shows the disturbance signal suppression circuit represented in FIG. 5.

FIG. 5 and FIG. 6 show a disturbance signal suppression circuit 82 according to a second embodiment of the invention. In the first embodiment, the high pass filter 11 is switched to H mode or L mode in response to the switching signal. In the second embodiment, a band pass filter 20 is used instead of high pass filter 11, where H mode or L mode is switched by means of switching signals. Accordingly, the second embodiment is different from the first embodiment only in terms of the bandpass filter construction.

Figure 7:
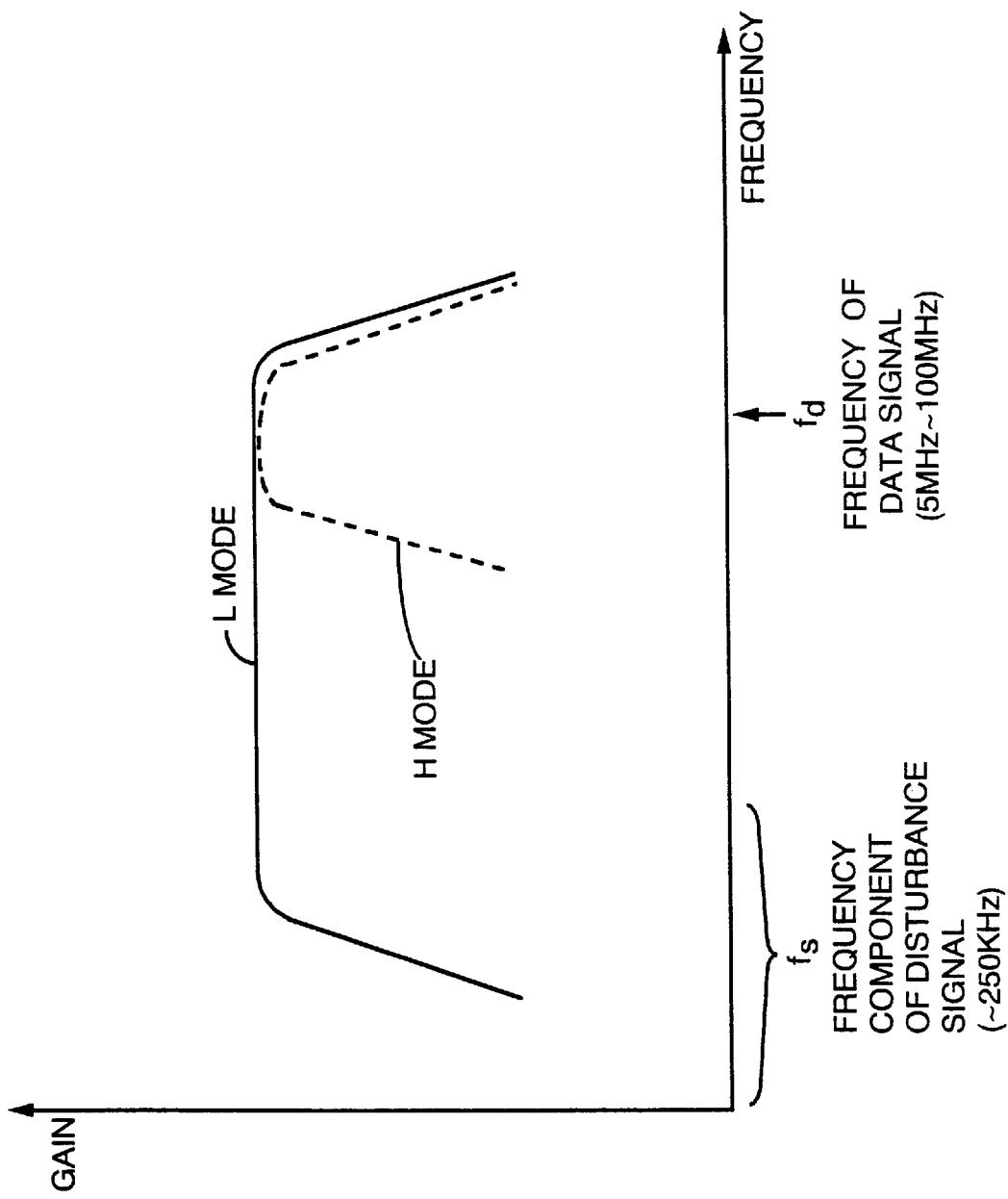
FIG. 7 shows characteristics of the filter according to the second embodiment of the invention.

In detail, the band pass filter 20 has two bandpass filters, one of which is a high (H) mode filter and another is a low (L) mode filter. The L mode filter cuts off data signals input to the input terminal 100. According to a switching signal, band pass filter 20 selects either L mode with a low cut-off frequency, for example, around 100 kHz, or H mode with a low cut-off frequency, for example, around 500 kHz-1 MHz, as shown in FIG. 7. The band pass filter 20 cuts off frequencies lower than the cut-off frequency (for example, 100 kHz) in the low area (L mode) and frequencies lower than the cut-off frequency (for example, 500 kHz) in the higher area (H mode), and then outputs the data signal which is not suppressed. FIG. 6 shows a diagram of a filter 14 having both L mode and H mode operations and the switch 15 for switching the mode of the filter 14.

In FIG. 6, one end of the capacitor 14a is connected to input terminal 100 and the other end of the electrode of the capacitor 14a is connected to the third resistor 14d. The other end of the third resistor 14d is connected to the output terminal 200. The other end of the capacitor 14a is also connected to one end of the first resistor 14b. When the other end of the first resistor 14b is grounded, the capacitor 14a, the first resistor 14b, and the third resistor 14d comprise the H mode band pass filter with a cut-off frequency in the high area.

The other end of capacitor 14a is connected to one end of second resistor 14c. When the other end of second resistor 14c is grounded, the capacitor 14a, the second resistor 14c, and the third resistor 14d comprise the L mode band pass filter. The capacitor 14a, the first resistor 14b, the second resistor 14c, and the third resistor 14d comprise filter 14.

A first switch 15a comprises an N type MOS transistor which receives a switching signal, shown in FIG. 4D, at the control electrode. The first switch 15a is connected between the other end of resistor 14b and a ground node. A second switch 15b comprises an N type MOS transistor which receives an inversion of the switching signal, shown in FIG. 4D, at the control electrode. The second switch 15b is connected between the other end of resistor 14c and a ground node. Inverter 15c receives a switching signal, shown in FIG. 4D, and inverts the switching signal and transmits the inverted switching signal to the control electrode of the second switch. The first and second switches 15a and 15b and the inverter 15c comprise a switch 15. For example, this switch may be a CMOS inverter which comprises a P type MOS transistor and N type MOS transistor connected serially between the power supply node and the ground node. The elements having the same reference numbers in FIG. 5 and FIG. 6 are the same elements or correspond to elements in FIG. 1 and FIG. 2. Accordingly, detailed explanation of the same elements is omitted.

Embodiment 3.

Figure 8:
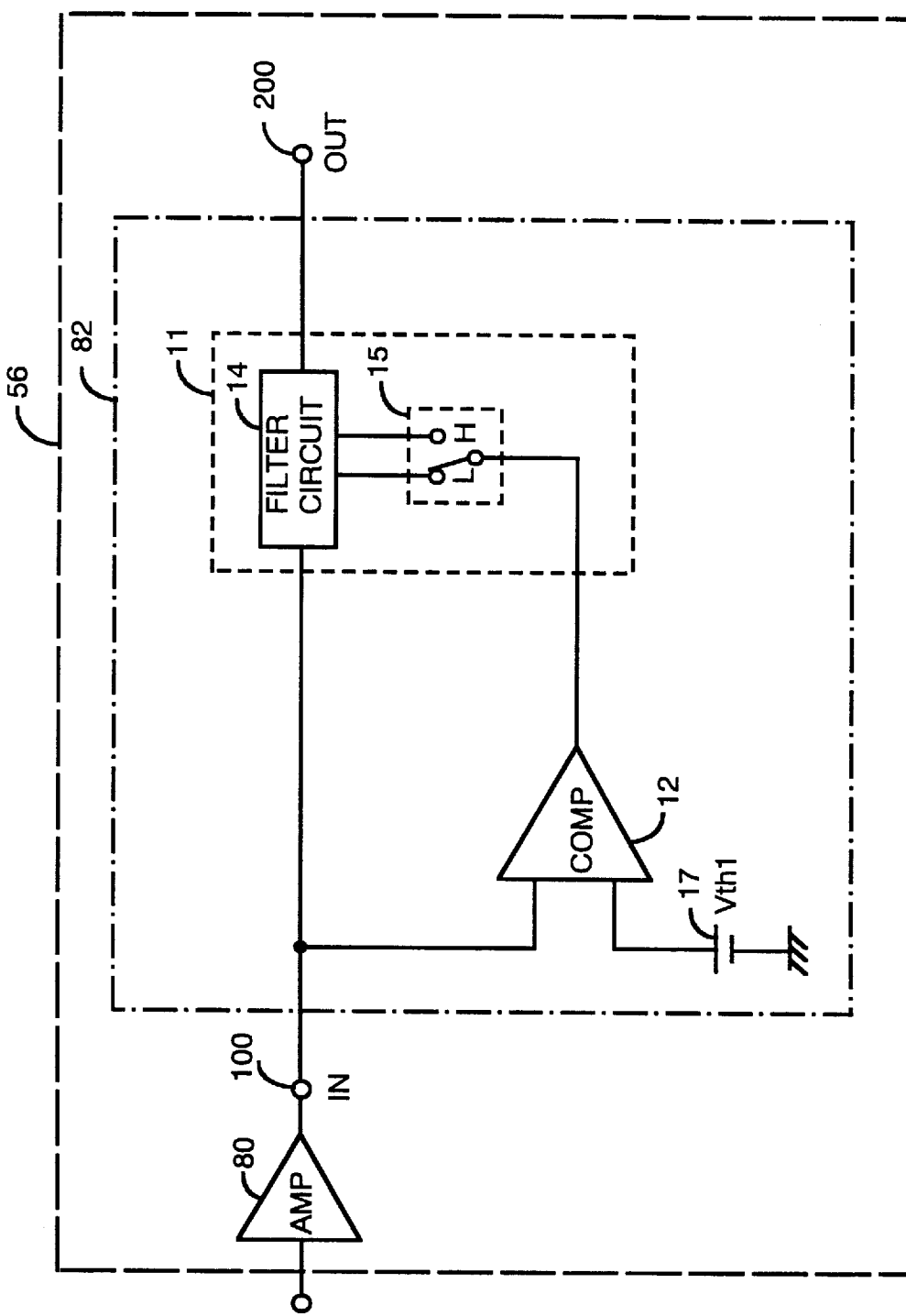
FIG. 8 shows a disturbance signal suppression circuit according to a third embodiment of the invention.
Figure 9:
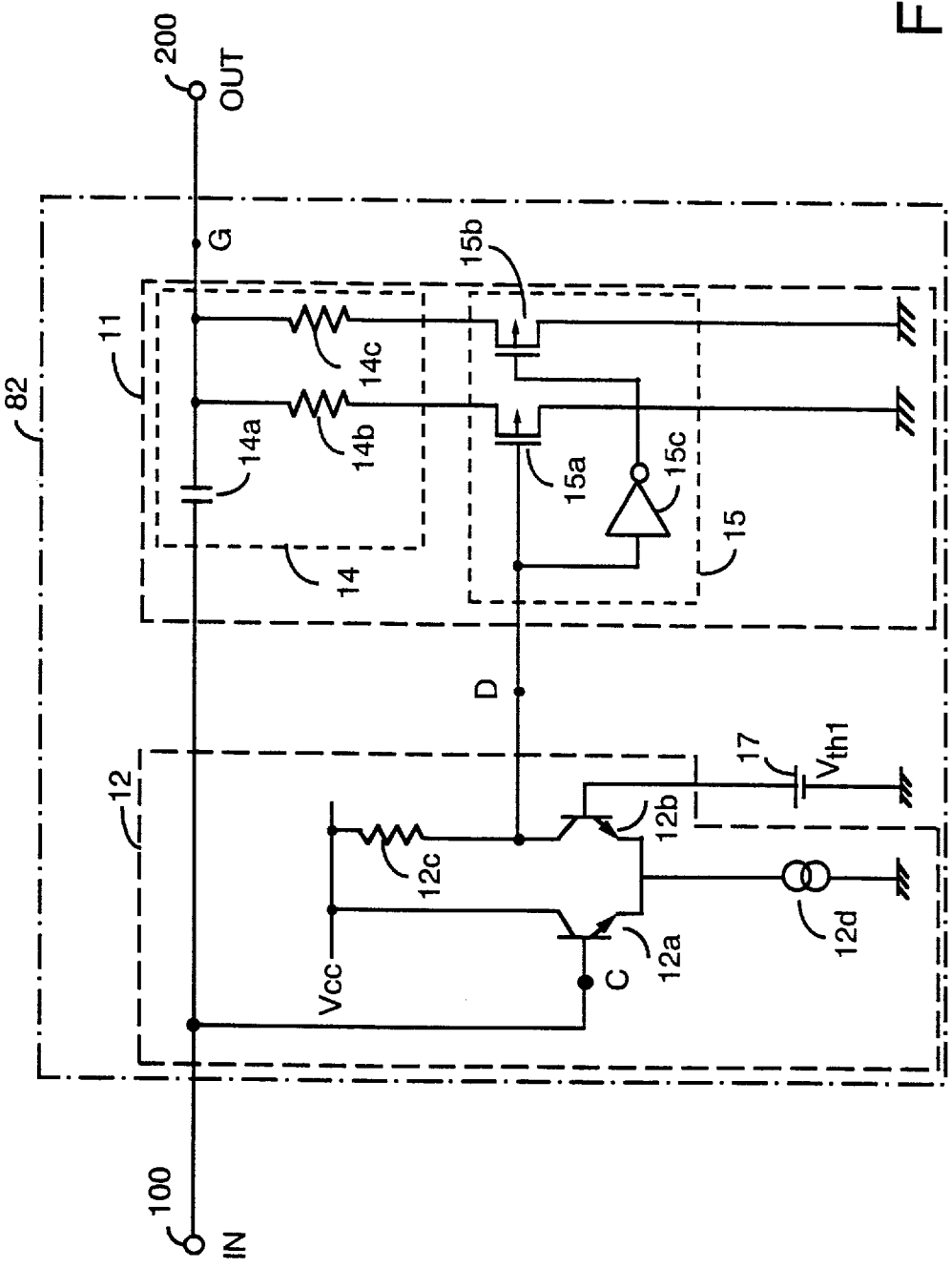
FIG. 9 shows the disturbance signal suppression circuit represented by FIG. 8.
Figure 10:
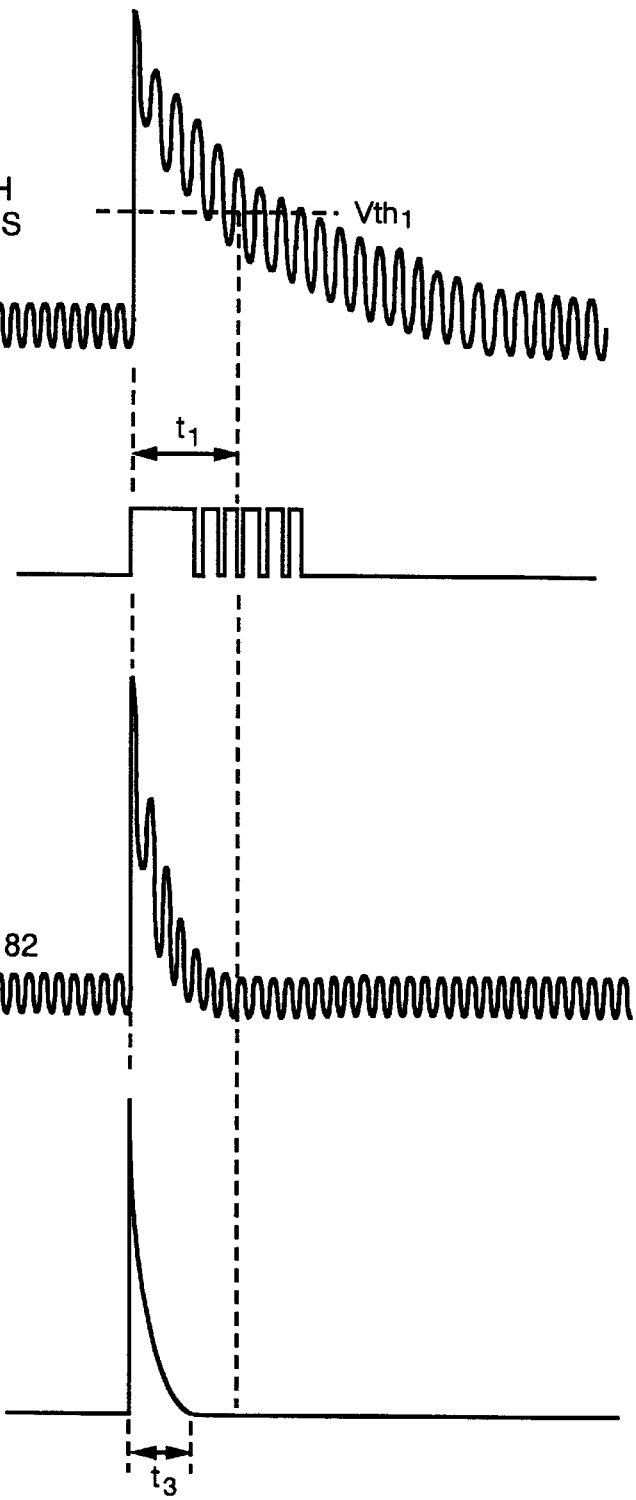
FIG. 10A shows a signal waveform at a point C shown in FIG. 9.
FIG. 10B shows a signal waveform at a point D shown in FIG. 9.
FIG. 10C shows a signal waveform at a point G shown in FIG. 9.
FIG. 10D shows a signal waveform of a suppressed disturbance component of the waveform in FIG. 10G.

FIG. 8 and FIG. 9 show a disturbance signal suppression circuit 82 according to the third embodiment of the invention. The waveform extending circuit 13 used in the first embodiment is removed. The other points are the same as that of the first embodiment. Disturbance signal suppression circuit 82 operates in the same way as the first embodiment when a disturbance signal is input to the input terminal 100. Therefore, detailed explanation of the third embodiment is omitted.

Embodiment 4.

Figure 11:
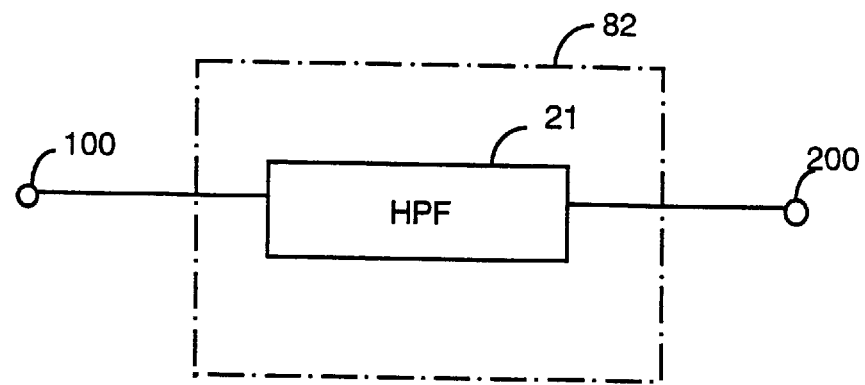
FIG. 11 shows a disturbance signal suppression circuit according to a fourth embodiment of the invention.
Figure 12:
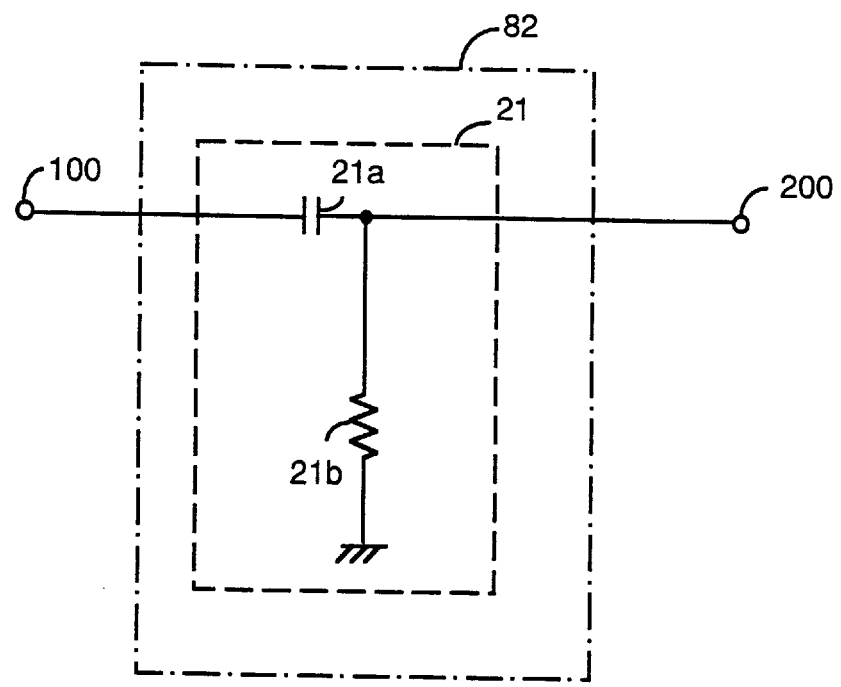
FIG. 12 shows the disturbance signal suppression circuit represented by FIG. 11.
Figure 13:
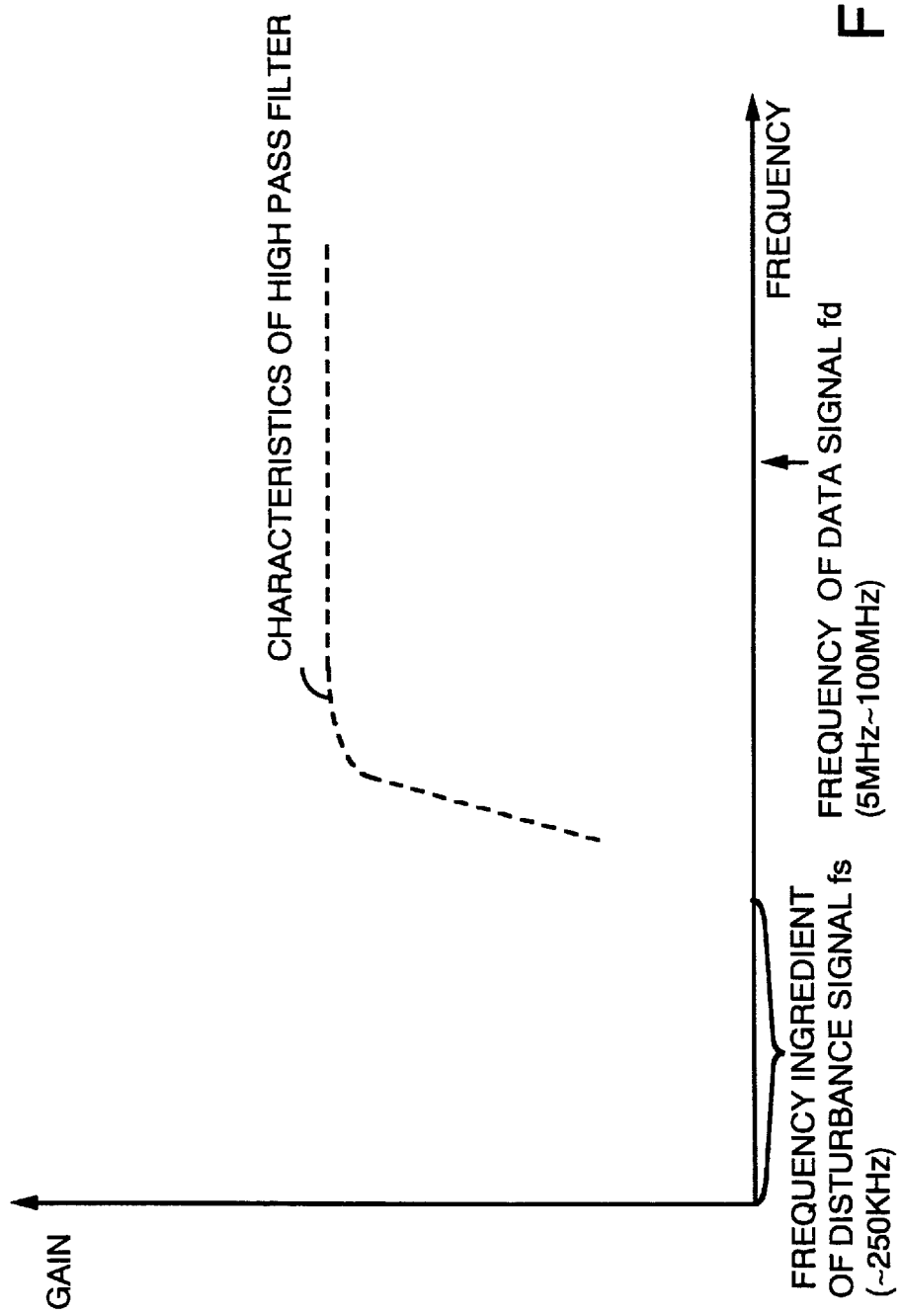
FIG. 13 shows frequency characteristics of a high pass filter according to the fourth embodiment of the invention.
Figure 14:
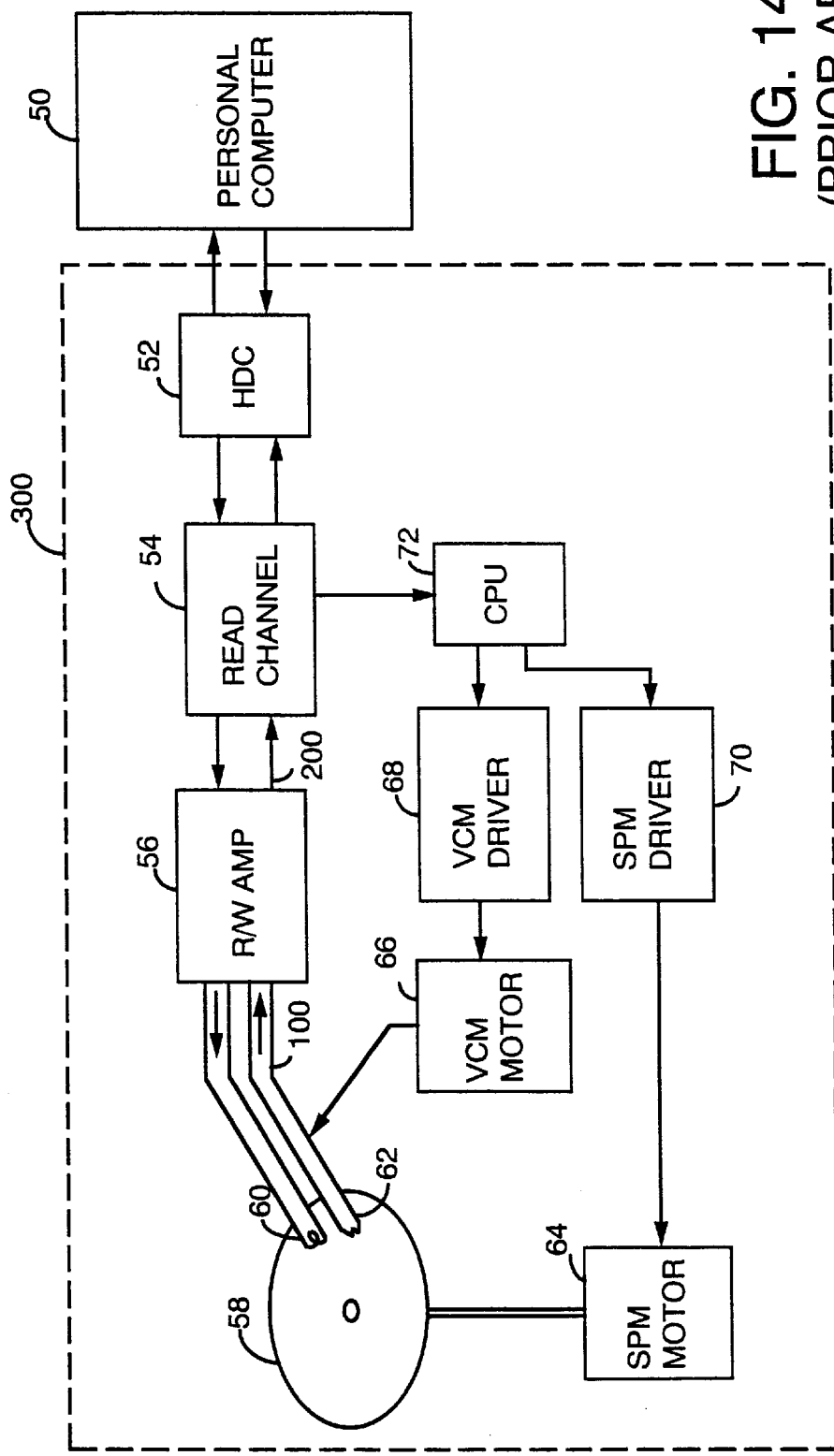
FIG. 14 shows a general block diagram of a hard disk drive.

FIG. 11 is a diagram of a fourth embodiment of the present invention where only the high pass filter 21 includes a disturbance signal suppression circuit 82 which suppresses disturbance signals. FIG. 12 shows an example of the disturbance signal suppression circuit 82 shown in FIG. 11. FIG. 13 shows frequency characteristics of the high pass filter 21 according to the fourth embodiment.

This high pass filter 21 comprises a capacitor 21a and a resistor 21b. This high pass filter 21 has the same frequency characteristics as the high pass filter 11 in H mode shown in FIG. 1. In the fourth embodiment, the disturbance signal suppression circuit 82 may be realized by a very simple circuit.

Figure 16A:
FIG. 16A shows a signal waveform read out through an MR head.
Figure 16B:
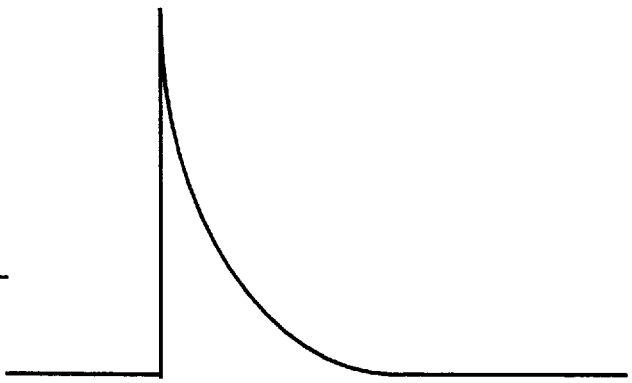
FIG. 16B shows a change of resistance of an MR element when and after the MR head touches a disc.
Figure 16C:
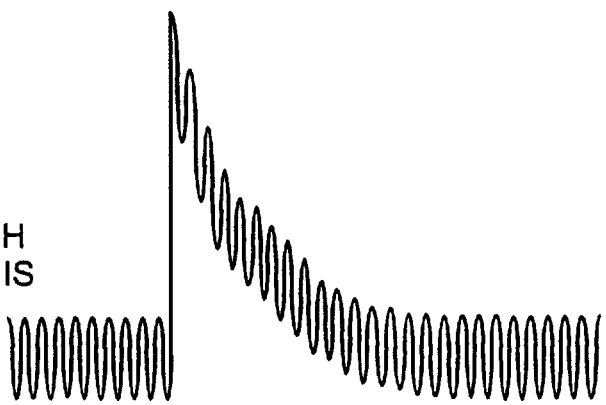
FIG. 16C shows a signal waveform generated when a disturbance signal is superposed on a data signal.
Figure 17:
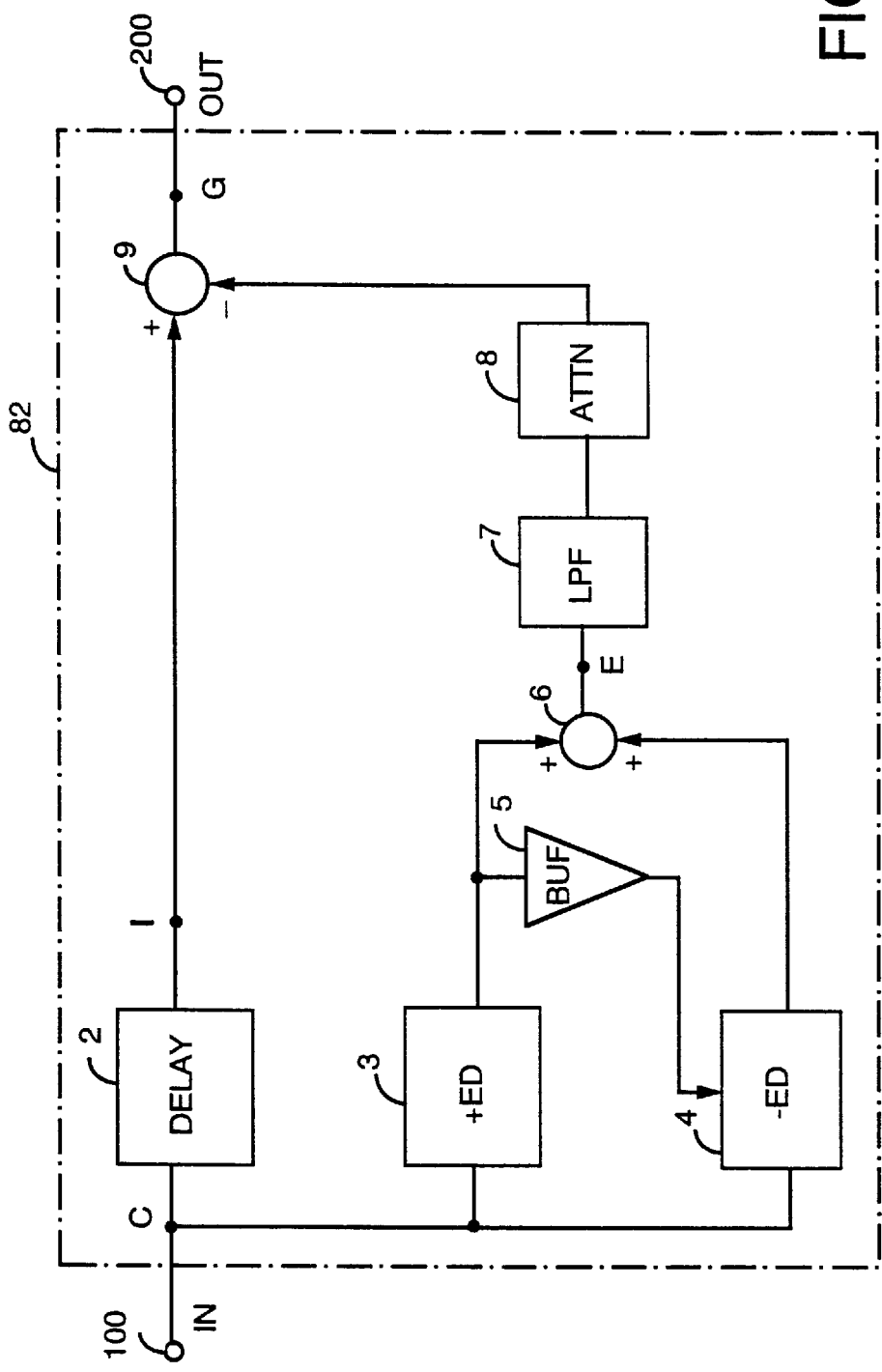
FIG. 17 shows a conventional disturbance signal suppression circuit which suppresses a disturbance signal in a read out data.
Figure 18A:
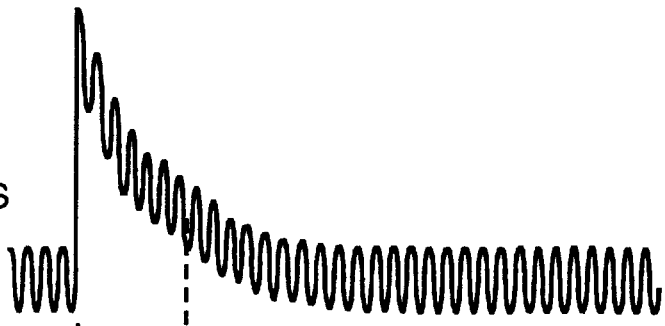
FIG. 18A shows a signal waveform at a point C shown in FIG. 17.
Figure 18B:
FIG. 18B shows a signal waveform at a point I shown in FIG. 17.
Figure 18C:
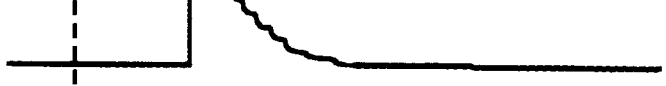
FIG. 18C shows a signal waveform at a point E shown in FIG. 17.
Figure 18D:
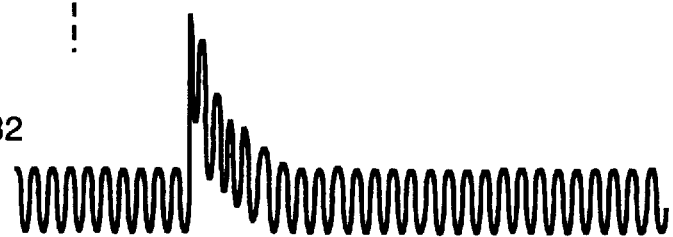
FIG. 18D shows a signal waveform at a point G shown in FIG. 17.

The operation of the fourth embodiment is explained below. When the MR head touches the disc and the disturbance waveform shown in FIG. 16B is generated, the disturbance signal is superposed on the data signal. Accordingly, the signal waveform shown in FIG. 16C is input to the input terminal 100 of the disturbance signal suppression circuit 82 shown in FIG. 11. In this fourth embodiment, the disturbance signal is always blocked since a high pass filter 21, for example, having the characteristics as shown in FIG. 13, is always connected to the input terminal 100. Accordingly, the output signal appearing at the output terminal 200 becomes the signal shown in FIG. 4E which shows that the disturbance signal is suppressed. In this fourth embodiment, distortion rarely appears in the data signal around 5–100 MHz if the cut-off frequency of the high pass filter 21 is about 250 kHz, namely, substantially equal to the frequency of the disturbance signal.

We claim:

1. A signal reproduction circuit for processing signals read from a recording medium by a magneto-resistive (MR) head, said circuit comprising:

a data input terminal for connection to an MR head;

an amplifier connected to said data input terminal, amplifying an output signal received from the MR head at said data input terminal, and outputting an internal signal;

a first circuit receiving the internal signal from said amplifier, detecting whether a disturbance signal, generated when the MR head touches a recording medium, is included in the output signal by comparing the internal signal with a reference potential level, and generating a switching signal having a second level for a time period when a disturbance signal is detected by said first circuit, the switching signal having a first level otherwise; and a second circuit comprising a filter circuit and a switching circuit, said filter circuit receiving the internal signal and having a first cut-off frequency and a second cut-off frequency higher than the first cut-off frequency, said filter circuit attenuating frequency components of the internal signal lower than a selected one of the first and second cut-off frequencies, and outputting a data signal; and said switching circuit receiving the switching signal and selecting the first cut-off frequency when the switching signal is at the first level and selecting the second cut-off frequency when the switching signal is at the second level.

2. The signal reproduction circuit according to claim 1 wherein said filter circuit is a high pass filter.

3. The signal reproduction circuit according to claim 1 wherein said filter circuit is a band pass filter.

4. The signal reproduction circuit according to claim 1 wherein said first circuit comprises:

a comparator having a first input node connected to an output node of said amplifier and a second input node receiving the reference potential level, comparing the internal signal with the reference potential level and outputting a comparison result signal having a first level when the internal signal is lower than the reference potential level and having a second level when the internal signal equals or is higher than the reference potential level; and a waveform extending circuit receiving the comparison result signal and outputting the switching signal to said switching circuit, said waveform extending circuit extending duration of the comparison result signal having the second level.

5. The signal reproduction circuit according to claim 4 wherein said filter circuit is a high pass filter.

6. The signal reproduction circuit according to claim 4 wherein said filter circuit is a band pass filter.

7. The signal reproduction circuit according to claim 4 wherein said first circuit comprises a comparator having a first input node connected to an output node of said amplifier and a second input node receiving the reference potential level, comparing the internal signal with the reference potential level, and outputting the switching signal having the first level when the internal signal is lower than the reference potential level and having the second level when the internal signal equals or is higher than the reference potential level.

8. The signal reproduction circuit according to claim 7 wherein said filter circuit is a high pass filter.

9. The signal reproduction circuit according to claim 7 wherein said filter circuit is a band pass filter.

10. The signal reproduction circuit according to claim 1 wherein the first cut-off frequency is approximately 100 kHz and the second cut-off frequency is approximately 1 MHz.

11. A signal reproduction circuit for processing signals read from a recording medium by a magneto-resistive (MR) head, the circuit comprising:

a data input terminal for connection to an MR head;

an amplifier connected to said data input terminal, amplifying an output signal received from the MR head at said data input terminal, and outputting an internal signal;

a comparator having a first input node connected to an output node of said amplifier and a second input node receiving a reference potential level, comparing the internal signal with the reference potential level and outputting a comparison result signal having a first level when the internal signal is lower than the reference potential level and having a second level when the internal signal equals or is higher than the reference potential level;

a waveform extending circuit receiving the comparison result signal and outputting a switching signal, said waveform extending circuit, in outputting the switching signal, extending duration of the comparison signal having the second level; and a high pass filter connected to the output node of said amplifier, receiving the switching signal, and attenuating frequency components of the internal signal lower than a cut-off frequency of said high pass filter when the switching signal has the second level, and outputting a data signal.

12. The signal reproduction circuit according to claim 11 wherein said waveform extending circuit extends duration of only the comparison result signal having the second level.

13. A signal reproduction circuit for processing signals read from a recording medium by a magneto-resistive (MR) head, the circuit comprising:

a data input terminal for connection to an MR head;

an amplifier connected to said data input terminal, amplifying an output signal received from the MR head at said data input terminal, and outputting an internal signal;

a comparator having a first input node connected to an output node of said amplifier and a second input node receiving a reference potential level, comparing the internal signal with the reference potential level and outputting a comparison result signal having a first level when the internal signal is lower than the reference potential level and having a second level when the internal signal equals or is higher than the reference potential level;

a waveform extending circuit receiving the comparison result signal and outputting a switching signal, said waveform extending circuit, in outputting the switching signal, extending duration of the comparison signal having the second level; and a band pass filter connected to the output node of said amplifier, receiving the switching signal, and attenuating frequency components of the internal signal lower than a lower cut-off frequency of said band pass filter when the switching signal has the second level, and outputting a data signal.

14. The signal reproduction circuit according to claim 13 wherein said waveform extending circuit extends duration of only the comparison result signal having the second level.

15. A signal reproduction circuit for processing signals read from a recording medium by a magneto-resistive (MR) head, the circuit comprising:

a data input terminal for connection to an MR head;

an amplifier connected to said data input terminal, amplifying an output signal received from the MR head at said data input terminal, and outputting an internal signal;

a comparator having a first input node connected to an output node of said amplifier and a second input node receiving a reference potential level, comparing the internal signal with the reference potential level and outputting a comparison result signal having a first level when the internal signal is lower than the reference potential level and having a second level when the internal signal equals or is higher than the reference potential level; and a high pass filter connected to the output node of said amplifier, receiving the comparison result signal, attenuating frequency components of the internal signal lower than a first cut-off frequency when the comparison result signal has the first level, attenuating frequency components of the internal signal lower than a second cut-off frequency, higher than the first cut-off frequency, when the comparison result signal has the second level, and outputting a data signal.

16. The signal reproduction circuit according to claim 15 wherein said high pass filter includes first and second cut-off frequencies, the second cut-off frequency being higher than the first cut-off frequency, the first cut-off frequency being selected when the comparison result signal has the first level and the second cut-off frequency being selected when the comparison result signal has the second level.

17. A signal reproduction circuit for processing signals read from a recording medium by a magneto-resistive (MR) head, the circuit comprising:

a data input terminal for connection to an MR head;

an amplifier connected to said data input terminal, amplifying an output signal received from the MR head at said data input terminal, and outputting an internal signal;

a comparator having a first input node connected to an output node of said amplifier and a second input node receiving a reference potential level, comparing the internal signal with the reference potential level and outputting a comparison result signal having a first level when the internal signal is lower than the reference potential level and having a second level when the internal signal equals or is higher than the reference potential level;

a waveform extending circuit receiving the comparison result signal and outputting a switching signal, said waveform extending circuit, in outputting the switching signal and extending duration of the comparison signal having the second level; and a high pass filter connected to the output node of said amplifier, receiving the switching signal, and attenuating frequency components of the internal signal lower than a first cut-off frequency of said high pass filter when the switching signal has the first level, and attenuating frequency components of the internal signal lower than a second cut-off frequency of said high pass filter when the switching signal has the second level, the second cut-off frequency being higher than the first cut-off frequency.

18. A signal reproduction circuit for processing signals read from a recording medium by a magneto-resistive (MR) head, the circuit comprising:

a data input terminal for connection to an MR head;

an amplifier connected to said data input terminal, amplifying an output signal received from the MR head at said data input terminal, and outputting an internal signal;

a comparator having a first input node connected to an output node of said amplifier and a second input node receiving a reference potential level, comparing the internal signal with the reference potential level and outputting a comparison result signal having a first level when the internal signal is lower than the reference potential level and having a second level when the internal signal equals or is higher than the reference potential level;

a waveform extending circuit receiving the comparison result signal and outputting a switching signal, said waveform extending circuit, in outputting the switching signal and extending duration of the comparison signal having the second level; and a band pass filter connected to the output node of said amplifier, receiving the switching signal, and attenuating frequency components of the internal signal lower than a first lower cut-off frequency of said band pass filter when the switching signal has the first level, and attenuating frequency components of the internal signal lower than a second lower cut-off frequency of said band pass filter when the switching signal has the second level, the second lower cut-off frequency being higher than the first lower cut-off frequency.

* * * * *

UNITED STATES PATENT AND TRADEMARK OFFICE
CERTIFICATE OF CORRECTION

PATENT NO.    : 5,834,969
DATED         : November 10, 1998
INVENTOR(S)   : Umeyama et al.

It is certified that error appears in the above-identified patent and that said Letters Patent is hereby corrected as shown below:

Column 11, Line 20, change "4" to --1--.

Signed and Sealed this

Twenty-third Day of February, 1999

Attest:

Attesting Officer

Q. TODD DICKINSON

Acting Commissioner of Patents and Trademarks